United States Patent
David et al.

(10) Patent No.: US 12,287,498 B2
(45) Date of Patent: Apr. 29, 2025

(54) FABRICATION OF BLAZED DIFFRACTIVE OPTICS BY THROUGH-MASK OXIDATION

(71) Applicant: Paul Scherrer Institut, Villigen (CH)

(72) Inventors: Christian David, Lauchringen (DE); Vitaliy Guzenko, Baden-Wuerttemben (DE)

(73) Assignee: Paul Scherrer Institut, Villigen PSI (CH)

( * ) Notice: Subject to any disclaimer, the term of this patent is extended or adjusted under 35 U.S.C. 154(b) by 580 days.

(21) Appl. No.: 17/638,951

(22) PCT Filed: Aug. 11, 2020

(86) PCT No.: PCT/EP2020/072463
§ 371 (c)(1),
(2) Date: Feb. 28, 2022

(87) PCT Pub. No.: WO2021/037549
PCT Pub. Date: Mar. 4, 2021

(65) Prior Publication Data
US 2022/0299685 A1    Sep. 22, 2022

(30) Foreign Application Priority Data
Aug. 27, 2019    (EP) ..................... 19193795

(51) Int. Cl.
*G03F 7/00*    (2006.01)
*G02B 5/18*    (2006.01)
*G03F 7/075*    (2006.01)
*G03F 7/40*    (2006.01)

(52) U.S. Cl.
CPC .......... *G02B 5/1857* (2013.01); *G03F 7/0005* (2013.01); *G03F 7/0755* (2013.01); *G03F 7/0757* (2013.01); *G03F 7/405* (2013.01)

(58) Field of Classification Search
CPC ...... G03F 7/0005; G03F 7/001; G03F 7/2063; G03F 7/2053
See application file for complete search history.

(56) References Cited

U.S. PATENT DOCUMENTS 5,998,066 A * 12/1999 Block ................... G03F 7/0007
430/296
2002/0160545 A1    10/2002 Anderson et al.
2016/0033784 A1 *  2/2016 Levola ............... G02B 27/4205
385/37

FOREIGN PATENT DOCUMENTS

CN    102466980 A    5/2012
CN    110082847 A    8/2019

OTHER PUBLICATIONS

McCoy Jake et al: "New lithographic techniques for x-ray spectroscopy", Proceedings of SPIE; [Proceedings of SPIE ISSN 0277-786X vol. 10524], SPIE, US, vol. 9905, Jul. 18, 2016 (Jul. 18, 2016), pp. 990524-990524, XP060074087, DOI: 10.1117/12.2232072, ISBN: 978-1-5106-1533-5.
Naulleau P P et al: "Fabrication of high-efficiency multilayer-coated binary blazed gratings in the EUV regime" Optics Communications, Elsevier, Amsterdam, NL, vol. 200, No. 1-6, Dec. 15, 2001 (Dec. 15, 2001), pp. 27-34, XP004326868, ISSN: 0030-4018, DOI: 10.1016/S0030-4018(01)01647-9.
Bloomstein T et al: "Direct patterning of spin-on glass with 157nm lithography: Application to nanoscale crystal growth", Journal of Vacuum Science and Technology: Part B. AVS /AIP, Melville, New York, NY, US, vol. 23, No. 6, Dec. 1, 2005 (Dec. 1, 2005), pp. 2617-2623, XP012080223, ISSN: 1071-1023, DOI: 10.1116/1.2101692.

* cited by examiner

*Primary Examiner* — Daborah Chacko-Davis
(74) *Attorney, Agent, or Firm* — Laurence A. Greenberg; Werner H. Stemer; Ralph E. Locher

(57) ABSTRACT

A method for manufacturing a low-angle blazed grating on a semiconductor or silicon substrate, includes spin-coating the substrate with resist layer or hydrogen or polysilsesquioxane, being 100-1000 nm or few hundred nanometers thick, applying grayscale irradiation lithography exposure to the resist layer, generating a dose modulated pattern therein, varying in response to absorbed energy density from irradiation lithography exposure. The coated, irradiated substrate is developed in solution, such as TMAH or NaOH, enabling a blazed profile having structures of thickness-dependent diffusion barriers or $SiO_2$, with 0-1000 nm height to emerge. Thermal oxidation in oxygen atmosphere at elevated temperature with the developed substrate, converts the upper silicon substrate layer into $SiO_2$ to a depth depending on the thickness of the pattern in the resist layer above. Hydrofluoric acid fluid removes the $SiO_2$, creating low-angle low-roughness blazed grating structure on silicon substrate.

9 Claims, 3 Drawing Sheets resist spinning grey tone exposure development thermal oxidation oxide removal

······ poly-silsesquioxane 1025 µC/cm²
—— Si blazed 1025 µC/cm²
······ poly-silsesquioxane 950 µC/cm²
—— Si blazed 950 µC/cm²

FABRICATION OF BLAZED DIFFRACTIVE OPTICS BY THROUGH-MASK OXIDATION

The present invention is related to a method to manufacture a low-roughness shallow-angle blazed profile, such as lines of a blazed grating, on a silicon substrate.

FIELD AND BACKGROUND OF THE INVENTION

Diffractive elements on reflecting surfaces are key components in optical instruments. They are used as energy dispersive elements in monochromators to select a narrow band of radiation from a broadband source, or to analyze the spectral composition of electromagnetic radiation. Another important application of such elements is to stretch and compress intense short light pulses from ultra-fast lasers in the so-called chirped pulse amplification (CPA) scheme.

In their simplest form, such diffractive elements consist of equally spaced (periodic) straight lines forming a grating on a planar surface and exploit the dependence of the diffraction angle of the diffraction orders on the wavelength to separate different spectral components of the incoming radiation. More advanced versions use diffraction from gratings on curved surfaces, for example to combine wavelength dispersive properties with focusing capability. Moreover, one can improve the optical properties of the gratings by varying the period of the grating lines continuously across the grating surface (so called Variable Line Spacing (VLS) gratings), or by producing gratings with curved lines, or by a combination of the above mentioned designs. In its most general form, diffractive elements on a reflective surface can consist of holographic structures that can be designed to have complicated optical functionality in order to manipulate the exiting light waves for applications such as beam shaping, wave front correction or wave front manipulation.

Generally, the exiting light from any diffractive optical element is distributed over several diffraction orders. Blazed gratings—also called echelette gratings—are a special type of diffraction gratings that are optimized to maximize the efficiency of diffraction into a given diffraction order. In contrast to the simpler and less efficient laminar gratings with symmetric line profiles, the lines of a blazed grating exhibit an asymmetric, triangular, sawtooth-shaped cross section, forming a step structure. The steps are tilted at the so-called blaze angle with respect to the grating surface.

The fabrication of laminar gratings can be done conveniently by holographic exposure of the line pattern into a resist spin-coated onto the reflective substrate. The resulting sinusoidal or binary resist pattern can then be transferred into the reflective surface, for example by plasma etching or ion etching techniques. This approach provides a large freedom of design for the grating pattern. However, it is not straightforward to produce gratings with blazed line profiles by holographic exposures that are required to provide high diffraction efficiency. Advanced pattern transfer techniques such as the ion beam etching under oblique angles or wet etching into crystalline substrates with appropriate orientation of the crystal planes have been applied to yield the desired blazed grating profile.

Alternative to holographic exposure, blazed grating lines can be produced by the so-called ruling technique, in which a diamond tool is mounted to a ruling engine at the appropriate angle and physically shapes a layer of soft metal deposited on the reflective substrate to yield arrays of grooves having the desired blaze angle. As this method is complicated and slow, the production of gratings is expensive. Moreover, it is not easily possible to produce gratings with curved lines.

Of particular relevance in context with this invention disclosure are applications with light having short wavelengths, i.e., the extreme ultra-violet (EUV) to the x-ray range. Here diffractive structures on reflective surfaces are used at synchrotron sources or at X-ray free-electron lasers as monochromators or spectral analyzers. The required specifications are stringent: as these gratings are usually used under grazing incidence, the length of the gratings has to be much bigger than the beam size, typically several centimeters up to several tens of centimeters. To maintain good reflectivity and low stray light, the surface of the grating lines must have roughness in the sub-nanometer range. The substrates must be of extreme quality regarding shape and slope errors and mostly consist of precisely polished silicon or silica substrates. Moreover, the required blaze angles are generally much smaller than for visible light. The highest quality blazed gratings for the EUV and x-ray range are made by ruling into a metal surface at a relatively high blaze angle, and the metal line profiles are then transferred into the underlying substrate material by proportional ion beam etching to give grating structures with the required shallow blaze angle. This limits the design of such gratings to straight lines. Due to this difficult and time-consuming procedure, high-end blazed gratings for EUV radiation or x-rays are only provided by very few suppliers.

SUMMARY OF THE INVENTION

The objective of the present invention is to provide a method to manufacture diffractive structures with a low-roughness blazed profile on a polished silicon substrate. The method can readily provide line profiles with small blaze angles, and unlike the techniques based on ruling, it is not restricted to producing gratings with straight lines.

This allows for fabrication of diffractive structures with more complex optical functionality. In comparison to fabrication of gratings by ruling, the presented method is particularly well suited to produce gratings with shallow blaze angles.

This objective is achieved according to the present invention by a method comprising the steps of:
  a) the silicon substrate is spin-coated with a layer of resist, such as for example hydrogen- or poly-silsesquioxane, with a thickness typically between 100 nm and 1000 nm, preferably a few hundreds of nanometers;
  b) a gray-scale irradiation lithography exposure step is applied to the resist-coated silicon substrate by exposing a dose-modulated pattern into the resist layer wherein the dose is varied locally in order to vary the dose absorbed in the resist layer;
  c) developing the coated and irradiated silicon substrate in a suitable solution, such as for example an tetra methyl ammonium hydroxide (TMAH) or sodium hydroxide (NaOH) solution, thereby partially removing the resist layer to create a resist thickness profile depending on the local exposure dose of the dose modulated pattern;
  d) performing a thermal oxidation step in an oxygen or water vapor atmosphere at elevated temperature with the developed silicon substrate thereby converting the surface of the silicon substrate into a silicon dioxide to a depth depending on the resist thickness in the resist layer above (e.g. the thicker the resist layer the lower the rate of oxidation); and e) selectively removing the resist and silicon dioxide, for example using a fluid containing hydrofluoric acid thereby creating a shallow-angle and low-roughness blazed grating structure on the silicon substrate.

Therefore, the presented invention is a new method of producing high efficiency diffractive optical elements used in reflection—especially gratings used in x-ray monochromators and x-ray analyzers. The method allows to combine (a) the flexibility of lithographic patterning, such as electron-beam lithography (EBL), in terms of optical functionality with (b) the high diffraction efficiency provided only by blazed structure profiles.

In the following, the description of the invention refers to "gratings", however, the invention can also be applied more generally to diffractive optics used in reflection, including zone plates, condensers, beam shapers, holograms and gratings with constant or with variable line density.

The method according to the present invention is based on patterning a suitable resist by a grey-tone exposure and partial removal of the resist during a subsequent development step to give a continuous resist thickness profile. This exposure could be done with electrons, ions, neutral particles, or photons. The structured resist layer is then transferred into the underlying substrate or a substrate layer by letting a chemical component diffuse through the resist layer that chemically modifies or chemically reacts with the underlying substrate or substrate layer. The resist layer and the underlying chemically modified or chemically converted part of the substrate is then selectively removed, such as for example a removal of silicon oxide in a fluid containing hydrofluoric acid.

The key of the invention is that the varying resist thickness on the surface of the silicon substrate determines how deep the substrate or substrate layer is chemically modified or chemically converted by modifying the diffusion of the chemical component through the resist layer to the substrate surface. As a result, a controlled amount of material can be removed from the substrate or substrate layer, and a continuous surface profile can be produced, including the blazed profile required for gratings with high diffraction efficiency.

A preferred embodiment of the present invention has been achieved by applying an EBL grey-tone e-beam lithography to a HSQ (hydrogen silsesquioxane) or poly-silsesquioxane layer coated on a flat single crystal silicon substrate followed by an oxidation step in an oxygen atmosphere at elevated temperatures. The surface of the silicon substrate is converted to silicon dioxide at a locally varying rate which is related to the patterning of the suitable resist (here the HSQ layer) by the grey-tone exposure to give the continuous profile. After removal of the resist and the silicon dioxide, the silicon substrate surface exhibits blazed grating structures with very high quality.

Alternatively, a further way to achieve the objectives according to the invention is to replace the steps b) and c) by nanoimprint lithography (NIL). Thus, the resulting structures can afterwards be coated by a single layer coating or a multilayer coating to produce devices with optimized reflectivity that can be used with multi-keV or hard x-rays or with EUV radiation.

Both techniques can be used to produce masters for manufacturing blazed gratings by replication techniques (for example by nanoimprint lithography).

Other substrate materials as well as lithographic techniques capable of generating thickness-modulated patterns in the resist, for example, direct laser writing, interference lithography or nanoimprint lithography can be also utilized.

Alternatively, a further way to achieve the objectives according to the invention is to replace the steps b) and c) by nanoimprint lithography (NIL). Thus, the resulting structures can afterwards be coated by a single layer coating or a multilayer coating to produce devices with optimized reflectivity that can be used with multi-keV or hard x-rays or with EUV radiation.

All techniques mentioned above can be used to produce masters for manufacturing blazed gratings by replication techniques (for example by nanoimprint lithography).

The substantial advantages of this techniques are:
a) Using thermal oxidation of the semiconductor substrate with a patterned resist layer serving as a diffusion rate modulating mask on it allows for obtaining very smooth continuous profiles on the surface of the substrate, including very smooth, shallow-angle blazed grating lines;
b) The roughness of the obtained blazed grating surfaces is very low and well below the roughness of the mask, and it does not require any alignment with respect to the crystallographic orientation of the silicon substrate;
c) This technique is not limited to fabricating gratings with straight lines only; a variety of curved shapes can be readily produced;
d) This method can be applied to flat as well as curved substrates;
e) By combining different resist profiles, several gratings with different blaze angle, different line spacing, or different line shape can be fabricated on the same semiconductor substrate with a single lithography step and a single oxidation step.

Preferred embodiments of the present invention are described hereinafter in more detail with reference to the attached drawings.

DETAILED DESCRIPTION OF THE INVENTION

In the following, a description of the process flow as used with silicon substrate and HSQ e-beam resist is described in detail. This description also works in principle with any other kind of substrates possibly requiring an adaptation of the resist materials and the chemicals used during the developing and/or the oxidizing step. The oxidizing step could be also replaced by a reaction process with Boron in order to yield a borosilicate glass on silicon substrate which can be also removed selectively, for example with hydrofluoric acid.

Figure 1A:
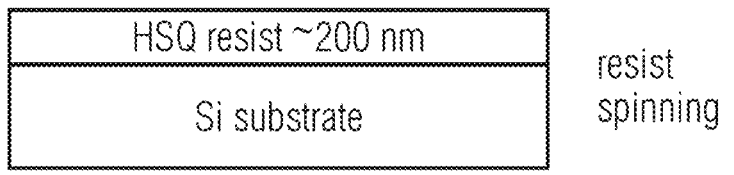
FIG. 1A schematically shows a substrate with a resist layer thereon in a process flow to generate a shallow-angle blazed grating on a silicon substrate.

As a starting material a polished monocrystalline silicon substrate has been used. A resist layer—in particular electron beam sensitive hydrogen silsesquioxane (HSQ)—was spin-coated on the silicon substrate to a thickness in the range of 200 nm and baked out at a moderate temperature in the range of 150° C. on a hot plate (FIG. 1a).

Figure 1B:
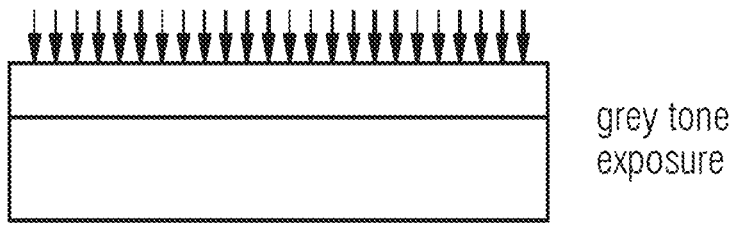
FIG. 1B shows the substrate with the resist layer thereon in which the resist layer is exposed to dose modulated patterns.

In the following, the grayscale electron beam lithography step has been performed. Dose modulated patterns were exposed into the HSQ resist, leading to local variations of the absorbed energy density inside the resist layer (see FIG. 1b).

Figure 1C:
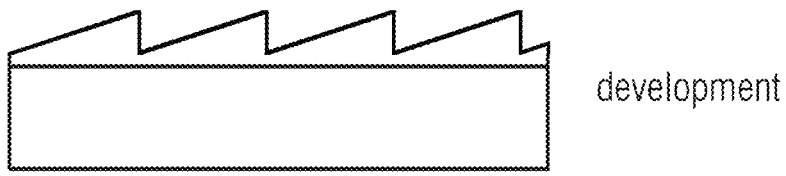
FIG. 1C shows the substrate with a blazed resist profile.

After the development in a suitable developer, e.g. TMAH or NaOH containing solution, for a fixed time and at a fixed temperature micro- and nanostructures made of $SiO_x$ (with x almost equal 2) with varying thickness were obtained. A schematic representation of a blazed HSQ resist profile is depicted in the FIG. 1c).

Figure 1D:
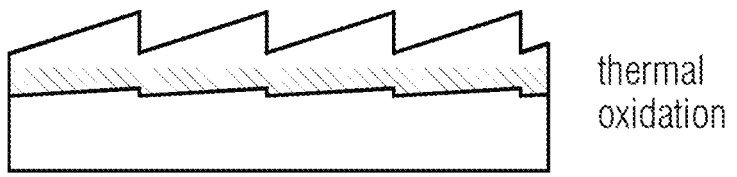
FIG. 1D shows the substrate after an oxidation step in which the profiles of the resist were transferred into the surface layer of the silicon substrate.

During the subsequent oxidation step the relatively high and rough saw-tooth profiles of the HSQ resist were transferred into the surface layer of the silicon substrate. Due to the local difference in the thickness of the HSQ mask and due to reduction of the oxidation rate of silicon with increasing oxide layer thickness, the interface profile between the silicon substrate and the $SiO_2$ becomes shallower and simultaneously smoother with progressing oxidation depth (see FIG. 1d).

Figure 1E:
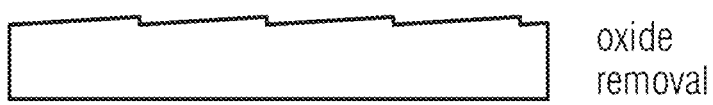
FIG. 1E shows the substrate after the mask and the oxide layer have been removed.
Figure 2A:
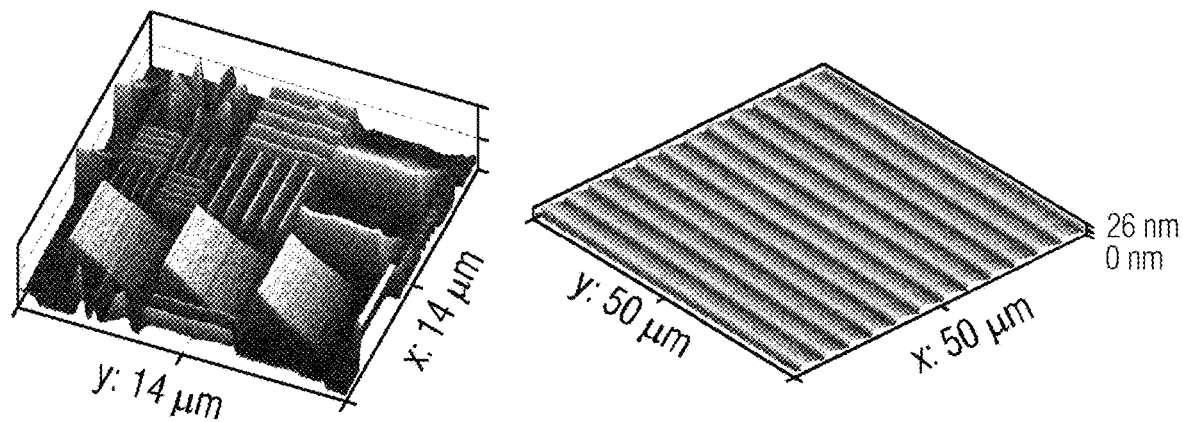
FIG. 2 a) Atomic force microscopy (AFM) images of a demonstrator sample (left) and a blazed grating with 4 µm pitch (right) and b) a cross-section line scan measured on the blazed grating, demonstrating a 14 nm tall saw-tooth profile (upper image) with roughness of 0.35 nm RMS (lower image), fabricated using HSQ as a resist.
Figure 2B:
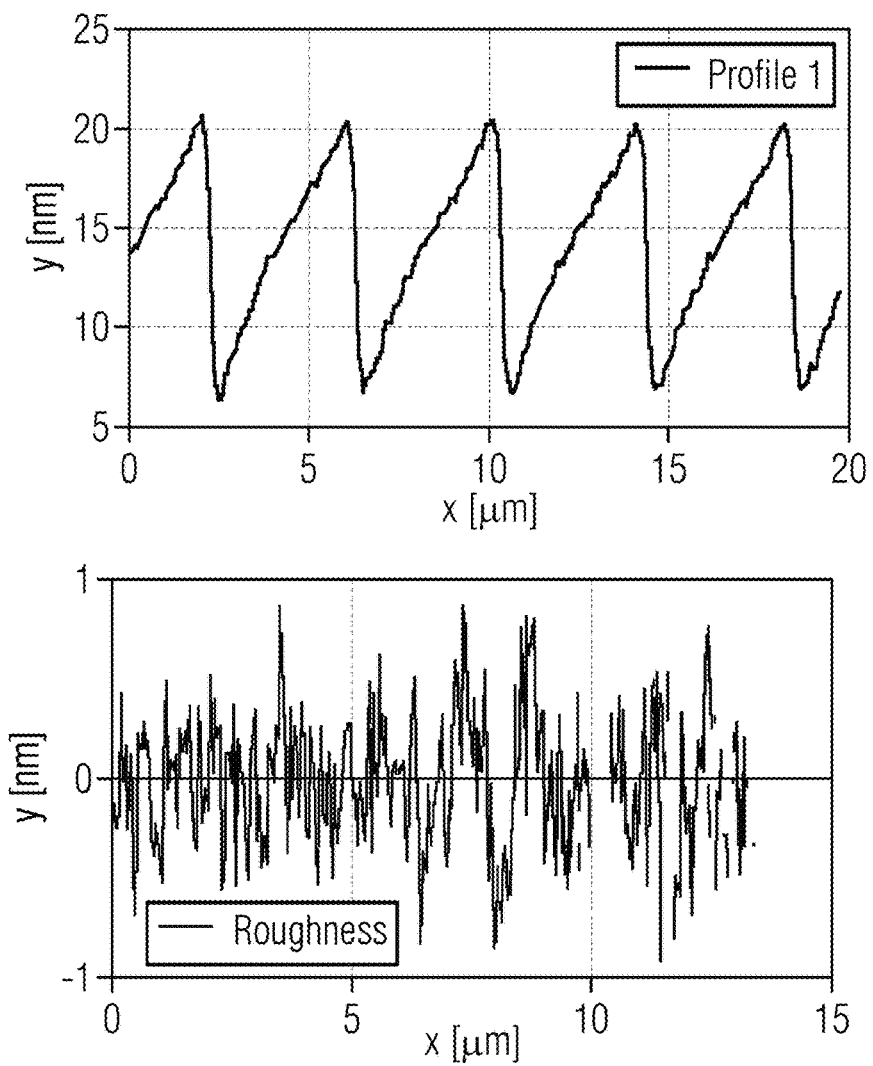

Finally, the HSQ mask as well as the oxide layer were removed with buffered oxide etch (BOE), a hydrofluoric acid containing solution, as depicted in see FIG. 1e). The AFM measurements on resulting blazed grating structures created on the surface of the silicon substrate confirmed that this process enables the blazed profiles angles about few degrees only and have very low roughness, with RMS values well below 0.5 nm (see FIG. 2).

The described process works stable with silicon substrates, but it is not restricted to silicon only.

The pattern transfer into silicon was done by initiating the oxidation reaction of the substrate material in Oxygen atmosphere. For different semiconductor substrate materials chemical reactions involving other gaseous or liquid reactants might be more suitable.

Figure 3A:
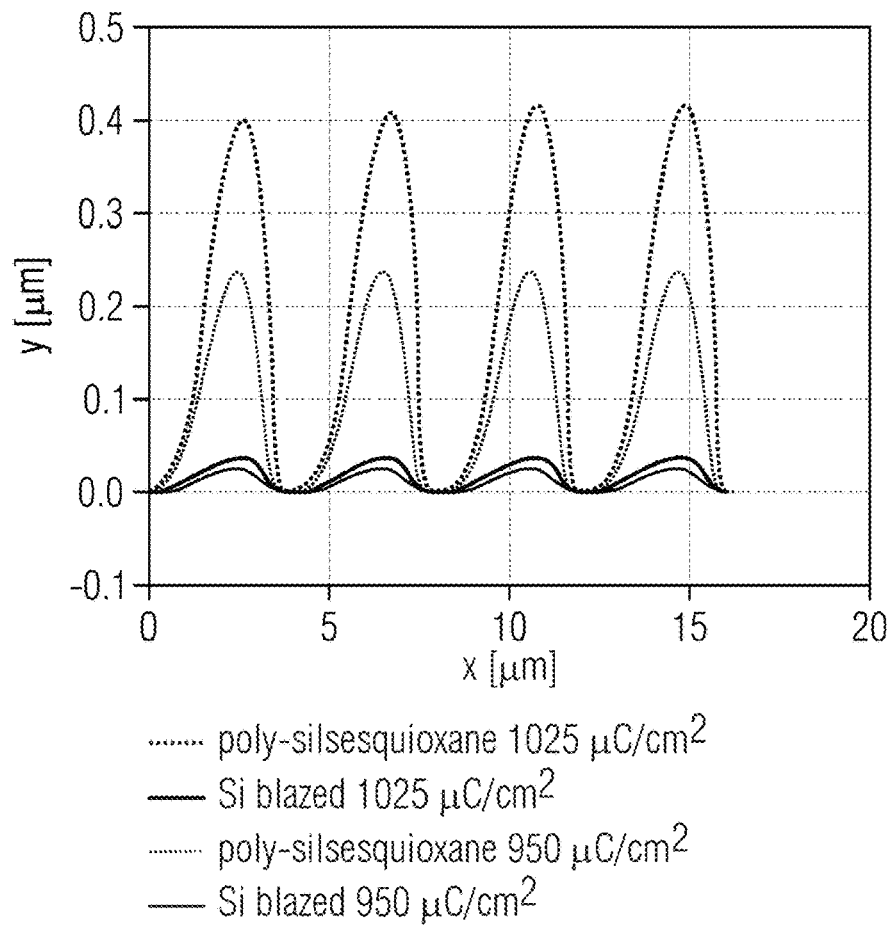
FIG. 3 a) Atomic force microscopy (AFM) cross-section line scan measured on the blazed grating with 4 µm pitch, demonstrating pattern transfer for two different profiles exposed in poly-silsesquioxane and b) Using poly-silsesquioxane resist results in blazed structures with the roughness of 0.19 nm RMS, which is lower compared to the blazed gratings obtained with HSQ resist mask.
Figure 3B:
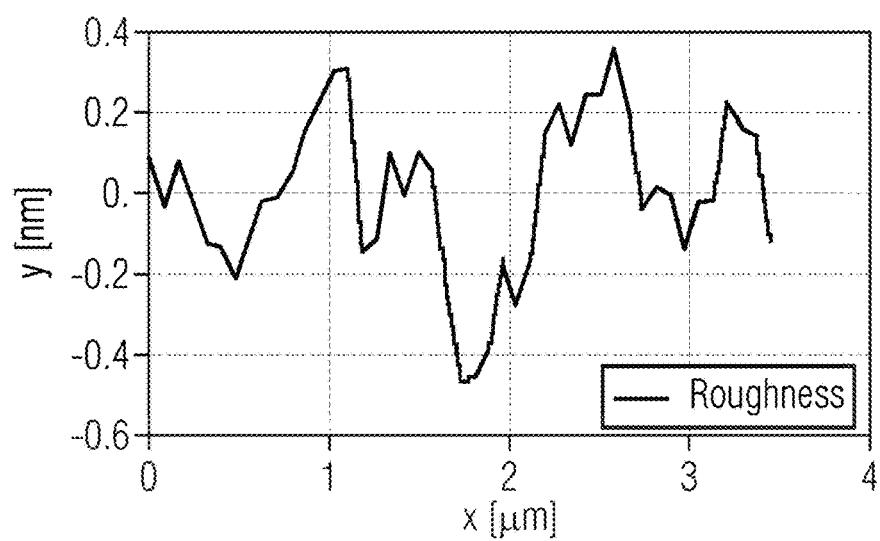

The choice of the resist is not restricted to HSQ only. The poly-silsesquioxanes was successfully used instead of HSQ (for experimental proof see FIG. 3). Other inorganic or organic resists may be suitable, too. In this case a separate step may be required for the removal of the resist material after the oxidation step and before removal of the thermal oxide.

The diffusion of the reactant, e.g. Oxygen, through the resist mask has to exhibit clear mask thickness dependence, enabling the propagation of the mask surface profile into the upper layer of the substrate as the interface between the initial and the chemically modified substrate material during the through-mask oxidation step.

The main potential field of applications of this invention is the fabrication of the reflective optics in a broad range of wavelengths (from hard X-rays to IR), for example, diffraction gratings, Fresnel zone plates, beam shapers etc.

The resulting structures can afterwards be coated by a single layer coating or a multilayer coating to produce devices with optimized reflectivity that can be used with multi-keV or hard x-rays or with EUV radiation.

The present invention can be used for example to fabricate a master for replication of the blazed optical elements and devices by nano-imprint lithography (NIL) as well as to transfer a resist pattern created from a master by a nano-replication technique.

The invention claimed is:

1. A method for manufacturing low-roughness, low-angle blazed profiles or lines of blazed gratings, on a silicon substrate, the method comprising:
    a) spin-coating the silicon substrate with a layer of resist having a thickness of between 100 nm and 1000 nm;
    b) applying gray-scale lithography exposure to the spin-coated silicon substrate to generate a dose modulated pattern into the resist layer, the dose varying locally in response to a density of absorbed energy from the irradiation of the lithography exposure;
    c) developing the dose modulated pattern of the resist layer in a solution, enabling a profile including structures of thickness-dependent diffusion barriers with a positive height up to 1000 nm to emerge;
    d) performing thermal oxidation in an oxygen atmosphere at elevated temperature to thereby convert an upper layer of the silicon substrate into silicon dioxide, wherein the upper layer of the silicon substrate is varyingly converted into the silicon dioxide depending on a thickness of the pattern in the resist layer above; and
    e) removing the resist layer, which was developed, and removing the silicon dioxide, which was converted from the silicon substrate, in a hydrofluoric acid fluid, creating the low-roughness, low-angle blazed grating structure on the silicon substrate.

2. The method according to claim 1, which further comprises using hydrogen silsesquioxane (HSQ) or poly-silsesquioxane having a thickness of a few hundred nanometers for the layer of resist.

3. The method according to claim 1, wherein the solution is TMAH or NaOH.

4. The method according to claim 1, which further comprises using silicon dioxide ($SiO_2$) for the diffusion barriers.

5. The method according to claim 1, which further comprises initially using a flat or curved polished silicon substrate as the semiconductor substrate.

6. The method according to claim 1, which further comprises using an e-beam or a direct laser writer in the gray-scale irradiation lithography exposure.

7. The method according to claim 1, which further comprises replacing steps b) and c) with nanoimprint lithography (NIL), and subsequently coating resulting structures with a single layer coating or a multilayer coating, producing devices with optimized reflectivity usable with multi-keV x-rays or with EUV radiation.

8. The method according to claim 1, which further comprises using the method to produce masters for manufacturing blazed gratings by replication techniques or nanoimprint lithography.

9. The method according to claim 1, wherein the blazed grating structure is formed by portions of the upper layer of the silicon substrate that are not converted into silicon dioxide in step d).

* * * * *